US009854687B2

(12) United States Patent
Amirkiai et al.

(10) Patent No.: US 9,854,687 B2
(45) Date of Patent: Dec. 26, 2017

(54) MULTI-LAYER SUBSTRATES INCLUDING THIN FILM SIGNAL LINES

(71) Applicant: FINISAR CORPORATION, Sunnyvale, CA (US)

(72) Inventors: Maziar Amirkiai, Sunnyvale, CA (US); Yunpeng Song, Fremont, CA (US); Hongyu Deng, Saratoga, CA (US)

(73) Assignee: FINISAR CORPORATION, Sunnyvale, CA (US)

( * ) Notice: Subject to any disclaimer, the term of this patent is extended or adjusted under 35 U.S.C. 154(b) by 0 days.

(21) Appl. No.: 14/923,034

(22) Filed: Oct. 26, 2015

(65) Prior Publication Data

US 2016/0050751 A1     Feb. 18, 2016

Related U.S. Application Data

(63) Continuation of application No. 14/824,883, filed on Aug. 12, 2015.

(Continued)

(51) Int. Cl.
*H05K 3/46* (2006.01)
*H05K 3/30* (2006.01)
(Continued)

(52) U.S. Cl.
CPC ......... *H05K 3/4682* (2013.01); *H05K 1/0242* (2013.01); *H05K 1/113* (2013.01);
(Continued)

(58) Field of Classification Search
CPC ...... H05K 1/113; H05K 1/0242; H05K 3/303; H05K 3/467; H05K 3/4667; H05K 3/4682;
(Continued)

(56) References Cited

U.S. PATENT DOCUMENTS 6,343,164 B1 * 1/2002 Robertsson .......... G02B 6/1221
  385/131
6,795,461 B1   9/2004 Blair et al.
(Continued)

FOREIGN PATENT DOCUMENTS

JP   2007271882 A   10/2007
WO      9111025       7/1991

OTHER PUBLICATIONS

International Search Report and Written Opinion for PCT Application No. PCT/US2015/057881 dated Feb. 12, 2016.
(Continued)

*Primary Examiner* — Akm Enayet Ullah
(74) *Attorney, Agent, or Firm* — Maschoff Brennan

(57) ABSTRACT

This disclosure generally relates to high-speed fiber optic networks that use light signals to transmit data over a network. The disclosed subject matter includes devices and methods relating to header subassemblies and/or optoelectronic subassemblies. In some aspects, the disclosed devices and methods may relate to a header subassembly that can include: a multi-layer substrate with a bottom layer, a top layer having top thin film signal lines, and one or more intermediate layers having thick film traces between the top layer and the bottom layer, the thick film traces electrically coupled to the top thin film signal lines; and optoelectronic components positioned over the multi-layer substrate and electrically coupled with the signal lines.

9 Claims, 8 Drawing Sheets

Related U.S. Application Data

(60) Provisional application No. 62/036,714, filed on Aug. 13, 2014, provisional application No. 62/039,758, filed on Aug. 20, 2014, provisional application No. 62/063,225, filed on Oct. 13, 2014, provisional application No. 62/069,707, filed on Oct. 28, 2014, provisional application No. 62/069,710, filed on Oct. 28, 2014, provisional application No. 62/069,712, filed on Oct. 28, 2014.

(51) Int. Cl.
  *H05K 1/02* (2006.01)
  *H05K 1/11* (2006.01)

(52) U.S. Cl.
  CPC ............ *H05K 3/303* (2013.01); *H05K 3/467* (2013.01); *H05K 3/4667* (2013.01); *H05K 3/4688* (2013.01); *H05K 2201/0391* (2013.01); *H05K 2201/094* (2013.01); *H05K 2201/09727* (2013.01); *H05K 2201/09736* (2013.01); *H05K 2201/10121* (2013.01)

(58) Field of Classification Search
  CPC ..... H05K 2201/094; H05K 2201/0391; H05K 2201/09727; H05K 2201/09736; H05K 2201/10121; H05K 3/4688

USPC .................................. 29/832; 361/752, 832
  See application file for complete search history.

(56) References Cited

U.S. PATENT DOCUMENTS

| | | | |
|---|---|---|---|
| 6,907,178 B2* | 6/2005 | Lerner | G02B 6/4214 333/247 |
| 8,378,475 B1 | 2/2013 | Veitch et al. | |
| 2001/0024551 A1 | 9/2001 | Yonemura et al. | |
| 2001/0051026 A1 | 12/2001 | Steinberg et al. | |
| 2004/0163836 A1* | 8/2004 | Kumar | H01S 5/02212 174/50 |
| 2004/0264884 A1 | 12/2004 | Liu | |
| 2005/0244095 A1 | 11/2005 | Ellison | |
| 2013/0279139 A1 | 10/2013 | Deng et al. | |
| 2014/0205246 A1 | 7/2014 | Li et al. | |

OTHER PUBLICATIONS

International Search Report and Written Opinion for PCT Application No. PCT/US2015/057883 dated Dec. 23, 2015.
International Search Report and Written Opinion for PCT Application No. PCT/US2015/057880 dated Feb. 26, 2016.

* cited by examiner

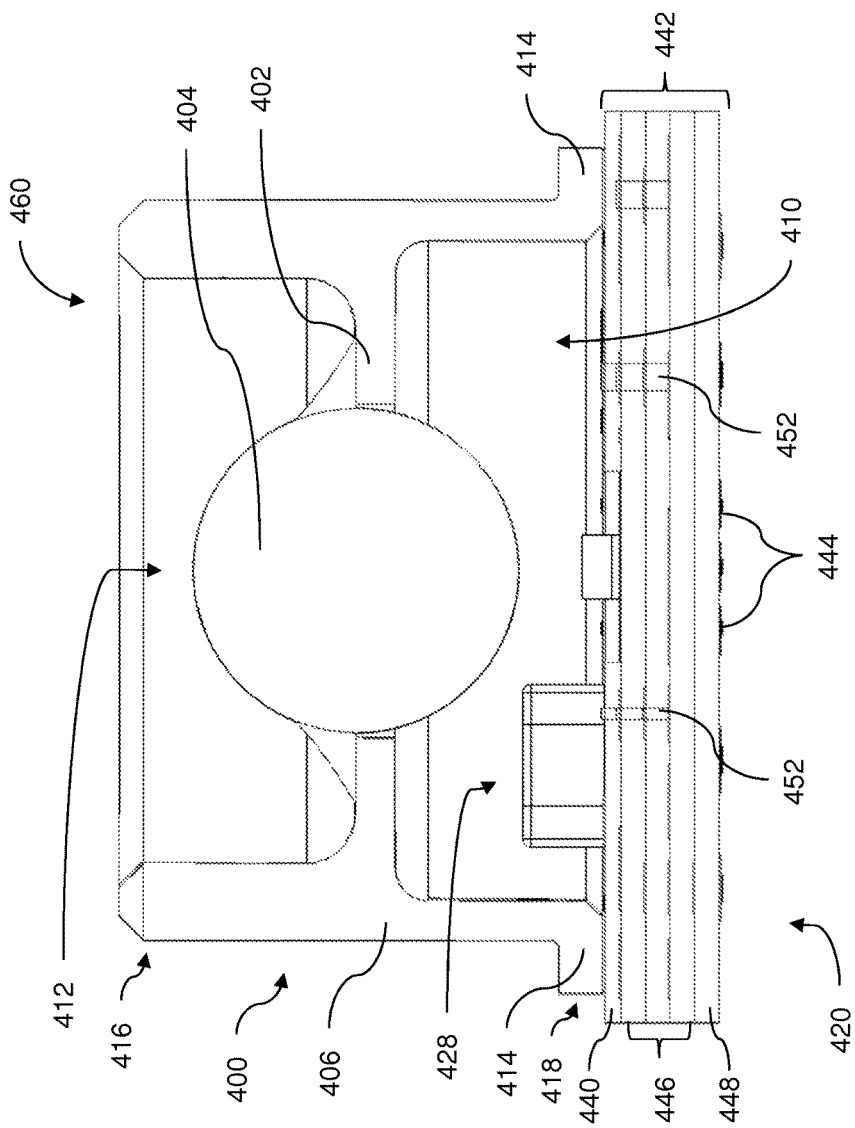

MULTI-LAYER SUBSTRATES INCLUDING THIN FILM SIGNAL LINES

CROSS-REFERENCE TO RELATED APPLICATIONS

This application is a continuation of patent application Ser. No. 14/824,883, filed Aug. 12, 2015, entitled FERRULE ASSEMBLIES, which claims priority to U.S. Provisional Application 62/036,714, filed Aug. 13, 2014, entitled FERRULE ASSEMBLIES, U.S. Provisional Application 62/039,758, filed Aug. 20, 2014, entitled LENS RECEPTACLES, U.S. Provisional Application 62/063,225, filed Oct. 13, 2014, entitled MULTI-LENS OPTICAL COMPONENTS, U.S. Provisional Application 62/069,707 filed Oct. 28, 2014, entitled MULTI-CHANNEL OPTOELECTRONIC SUBASSEMBLIES, U.S. Provisional Application 62/069,710 filed Oct. 28, 2014, entitled MULTI-LAYER SUBSTRATES, and U.S. Provisional Application 62/069,712 filed Oct. 28, 2014, entitled SUBSTRATES INCLUDING OPTOELECTRONIC COMPONENTS; which are all incorporated by reference herein in their entirety.

BACKGROUND

The present disclosure relates to high-speed fiber optic networks that use light signals to transmit data over a network. Fiber optic networks have various advantages over other types of networks such as copper wire based networks. Many existing copper wire networks operate at near maximum possible data transmission rates and at near maximum possible distances for copper wire technology. Fiber optic networks are able to reliably transmit data at higher rates over further distances than is possible with copper wire networks.

The claimed subject matter is not limited to configurations that solve any disadvantages or that operate only in environments such as those described above. This background is only provided to illustrate examples of where the present disclosure may be utilized.

SUMMARY

In one example, a header subassembly includes: a multi-layer substrate with a bottom layer, a top layer having top thin film signal lines, and one or more intermediate layers having thick film traces between the top layer and the bottom layer, the thick film traces being electrically coupled to the top thin film signal lines; and optoelectronic components positioned over the multi-layer substrate and electrically coupled with the signal lines.

In another example, a header subassembly includes: a multi-layer substrate with a bottom layer, a top layer having top thin film signal lines having a first dimension tolerance, and one or more intermediate layers having thick film traces between the top layer and the bottom layer, the thick film traces being electrically coupled to the top thin film signal lines, and the thick film traces having a second dimension tolerance larger than the first dimension tolerance; and optoelectronic components positioned over the multi-layer substrate and electrically coupled with the signal lines.

In yet another example, a method includes: forming material layers including a top material layer, a bottom material layer, and intermediate material layers; forming thick film traces on at least one of the material layers by thick film metallization; and forming thin film signal lines on at least one of the material layers by thin film metallization.

In a further example, a method includes: forming a multi-layer substrate including forming a bottom layer, a top layer and intermediate layers, forming thick film traces on at least one of the intermediate layers by thick film metallization, and forming thin film signal lines on a top layer by thin film metallization; and coupling one or more optoelectronic components to the multi-layer substrate, the optoelectronic components configured to transmit or receive optical signals.

This Summary is provided to introduce a selection of concepts in a simplified form that are further described below in the Detailed Description. This Summary is not intended to identify key features or essential characteristics of the disclosed subject matter, nor is it intended to be used as an aid in determining the scope of the claims. Additional features and advantages will be set forth in the description which follows, and in part will be obvious from the description, or may be learned by practice.

BRIEF DESCRIPTION OF THE DRAWINGS

FIG. 1B is a side cross-sectional view of the optoelectronic subassembly of FIG. 1A.

DETAILED DESCRIPTION

Figure 1A:
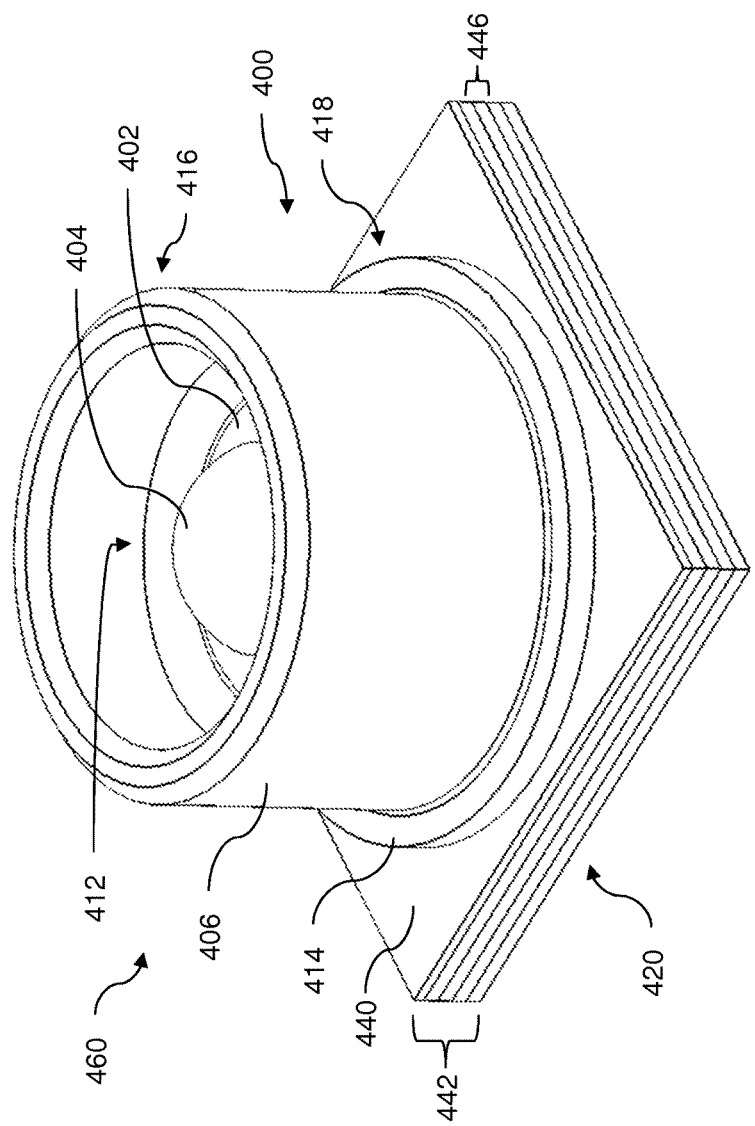
FIG. 1A is a perspective view of an example optoelectronic subassembly.
Figure 2A:
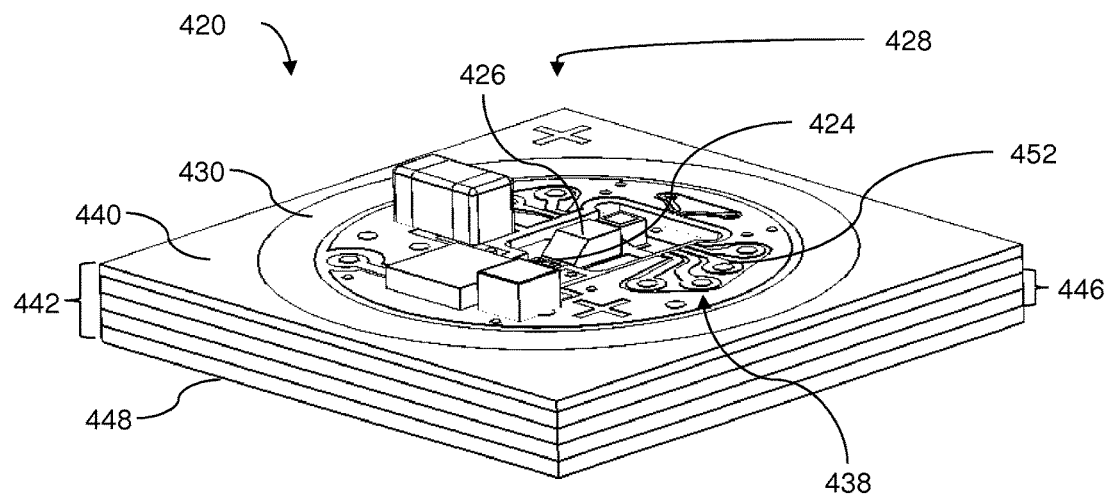
FIG. 2A is a top perspective view of a header subassembly of the optoelectronic subassembly of FIGS. 1A-1B.
Figure 2B:
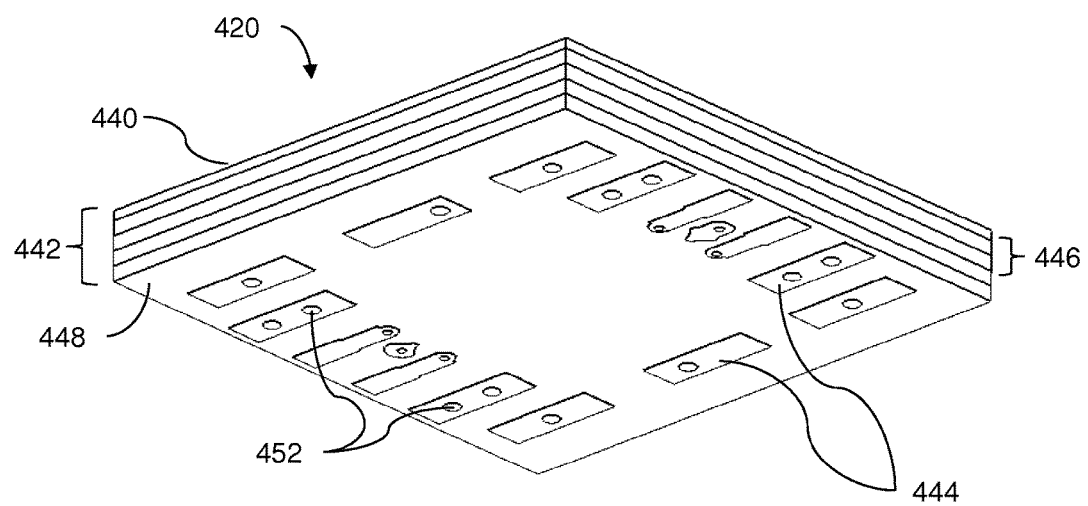
FIG. 2B is a bottom perspective view of the header subassembly of the optoelectronic subassembly of FIGS. 1A-1B.
Figure 2C:
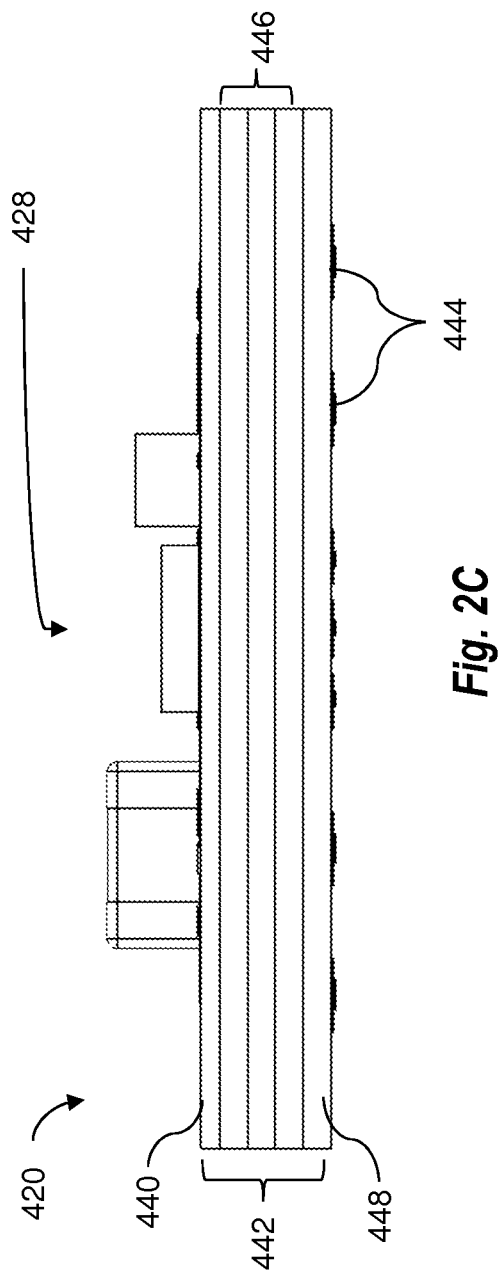
FIG. 2C is a side view of the header subassembly of the optoelectronic subassembly of FIGS. 1A-1B.
Figure 2D:
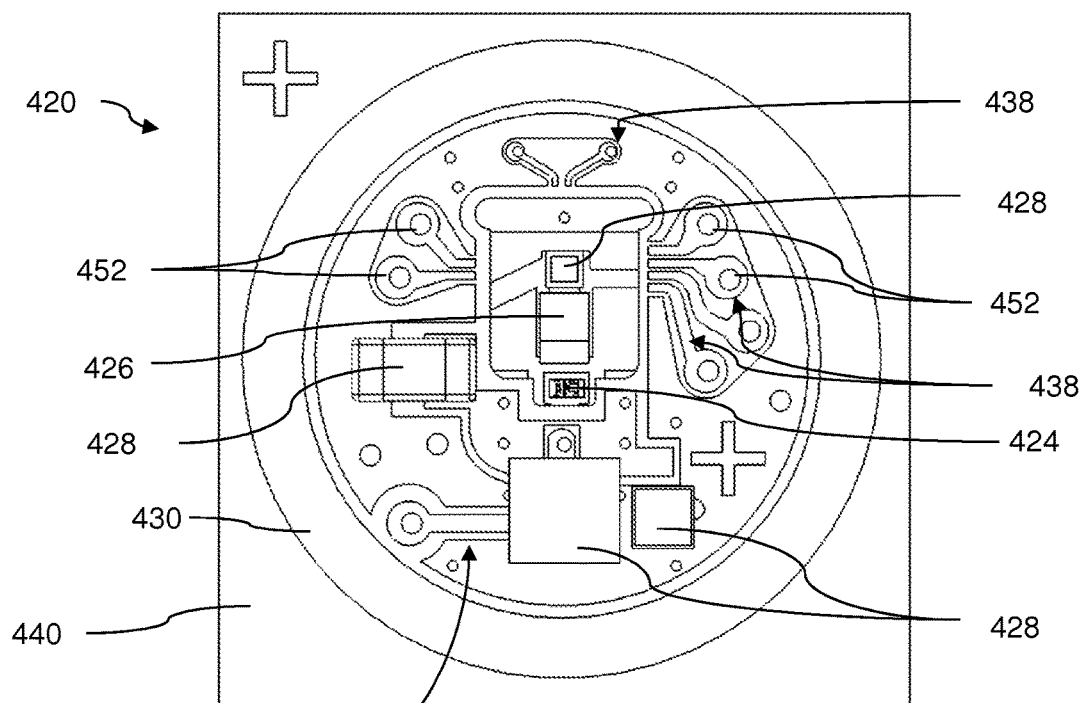
FIG. 2D is a top view of the header subassembly of the optoelectronic subassembly of FIGS. 1A-1B.
Figure 2E:
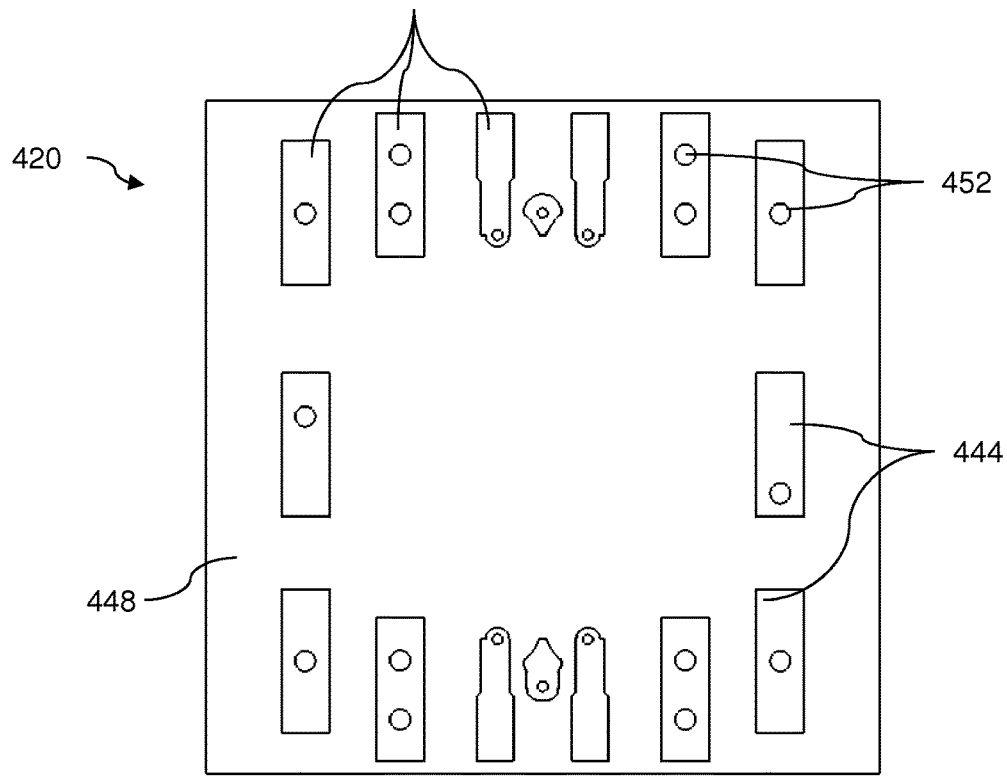
FIG. 2E is a bottom view of the header subassembly of the optoelectronic subassembly of FIGS. 1A-1B.
Figure 3:
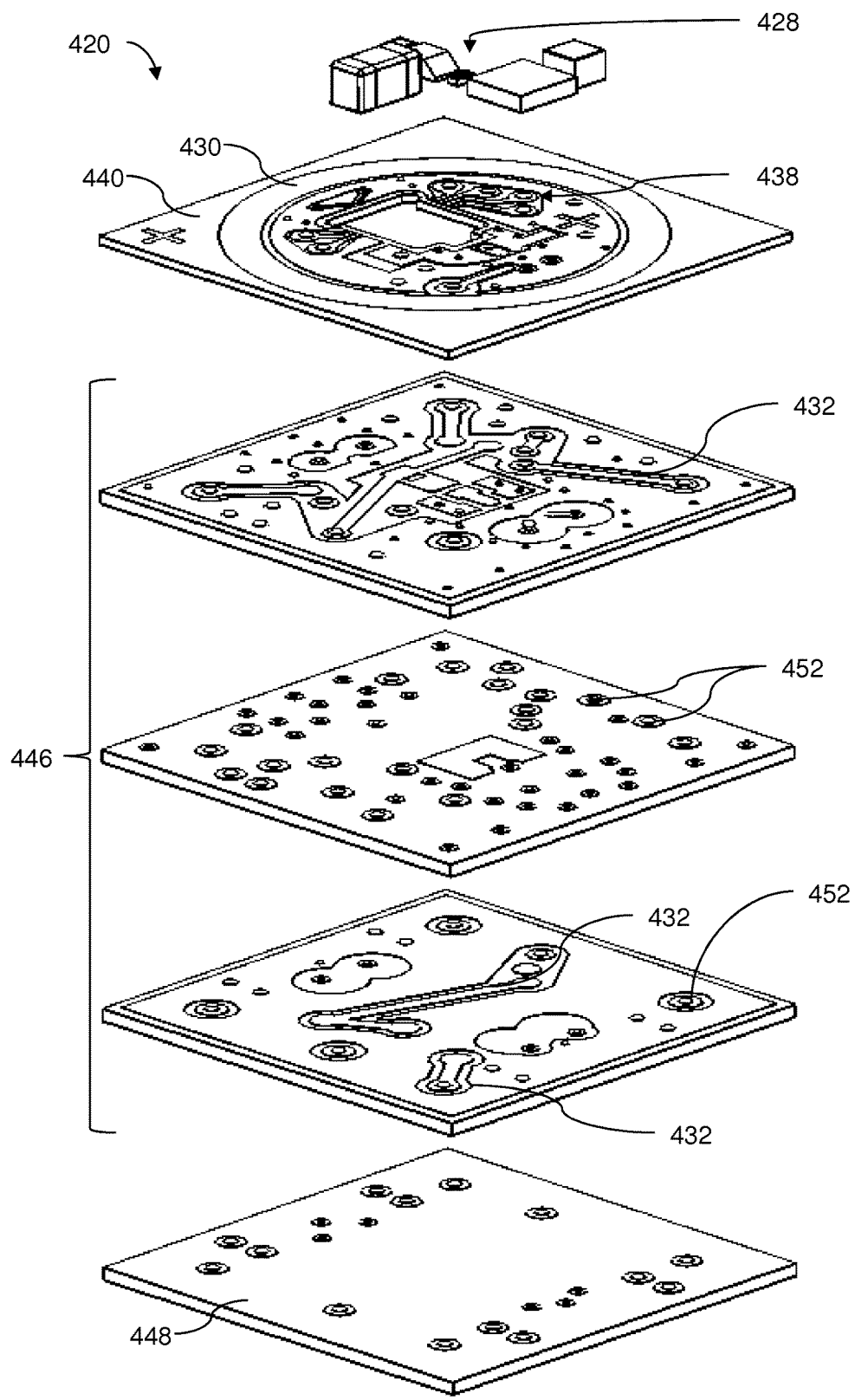
FIG. 3 is an exploded perspective view of the header subassembly of the optoelectronic subassembly of FIGS. 1A-1B.

Reference will be made to the drawings and specific language will be used to describe various aspects of the disclosure. Using the drawings and description in this manner should not be construed as limiting its scope. Additional aspects may be apparent in light of the disclosure, including the claims, or may be learned by practice.

The terms and words used in the following description and claims are not limited to the bibliographical meanings, but are merely used to enable a clear and consistent understanding of the disclosure. It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those skilled in the art, may occur in amounts that do not preclude the effect the characteristic was intended to provide.

The term "optoelectronic subassembly" may be used to refer to any portion of an optoelectronic assembly. However, at times this disclosure may use "optoelectronic subassembly" to refer to specific portions of an optoelectronic assembly, as may be indicated by context.

High-speed fiber optic networks use light signals (which may also be referred to as optical signals) to transmit data over a network. Fiber optic networks have various advantages over other types of networks such as copper wire based networks. Many existing copper wire networks operate at near maximum possible data transmission rates and at near maximum possible distances for copper wire technology. Fiber optic networks are able to reliably transmit data at higher rates over further distances than is possible with copper wire networks.

Although fiber optic networks use light signals to carry data, many electronic devices such as computers and other network devices use electrical signals. Accordingly, optoelectronic assemblies may be used to convert electrical signals to optical signals, convert optical signals to electrical signals, or convert both electrical signals to optical signals and optical signals to electrical signals.

Optoelectronic assemblies may include optoelectronic subassemblies ("OSAs"), such as receiver optoelectronic subassemblies ("ROSAs"), transmitter optoelectronic subassemblies ("TOSAs"), or both. A ROSA receives light signals with a light detector such as a photodiode and converts light signals into electrical signals. A TOSA receives electrical signals and transmits corresponding light signals. A TOSA may include an optical transmitter such as a laser that generates light that is transmitted through a fiber optic network. Optoelectronic assemblies or subassemblies may include various components such as optical components and/or electronic components.

Optoelectronic assemblies or subassemblies may include various components such as optical components and/or electronic components. Optical components involve optical signals and may, for example, emit, receive, transmit, carry, focus, and/or collimate optical signals. Electrical components involve electrical signals may, for example, receive, transmit, carry, transduce, transform, modulate, and/or amplify electronic signals. Optoelectronic components may involve both electrical and optical signals, and may be referred to as transducer components. Optoelectronic components may change optical signals to electrical signals and/or change electrical signals to optical signals (e.g., diodes or lasers).

Some optoelectronic assemblies may include multiple channels ("multi-channel optoelectronic assemblies"), with each channel corresponding to a set of one or more optical signals travelling through an optical fiber. Multi-channel optoelectronic assemblies may support increased data transfer rates through fiber optic networks. For example, a four channel optoelectronic assembly may be able to send and receive data at data transfer rates of approximately four times the data transfer rate of a comparable single channel optoelectronic assembly.

Ferrule assemblies may be used in fiber optic networks to physically and/or optically couple optical fibers with optoelectronic assemblies, optoelectronic subassemblies, optical components and/or electronic components. For example, ferrule assemblies may be used to couple ROSAs and/or TOSAs to optical fibers that are part of a fiber optic network thereby permitting the ROSA to receive optical signals and/or permitting the TOSA to transmit optical signals. Additionally or alternatively, ferrule assemblies may form part of an optoelectronic assembly or subassembly configured to transmit or receive electrical or optical signals in a fiber optic network.

Some optoelectronic assemblies may include hermetically sealed housings to protect components. However, space within hermetically sealed housings may be limited, especially if the optoelectronic assemblies comply with small form factor industry standards. Furthermore, increasing the size of hermetically sealed housings may increase the costs of producing optoelectronic assemblies. Conversely, decreasing the size of hermetically sealed housings may decrease the costs of producing optoelectronic assemblies.

Producing some hermetically sealing structures may increase the production costs of optoelectronic assemblies. In some circumstances, producing hermetically sealing structures with greater hermetically sealed portions may be more expensive than producing hermetically sealing structures with smaller hermetically sealed portions. Some hermetic sealing structures may add to the complexity of optoelectronic assemblies. Additionally or alternatively, some hermetic sealing structures may increase the size of optoelectronic assemblies.

Optoelectronic assemblies may need to comply with certain standards that may specify aspects of optoelectronic assemblies such as size, power handling, component interfaces, operating wavelengths or other specifications. Examples of such standards include CFP, XAUI, QSFP, QSFP+, XFP, SFP and GBIC. Complying with such standards may limit the structure, size, cost, performance or other aspects of optoelectronic assembly designs. Such standards may also limit configurations of components of optoelectronic assemblies such as receptacles that receive ferrule assemblies and/or hermetic sealing structures such as housings.

In some optoelectronic assemblies, electronic and/or radio frequency signal transmission lines ("RF lines") may couple lasers or other components of optoelectronic assemblies. The electrical performance of the RF lines ("RF performance" or "RF response") may be important to the operation optoelectronic assemblies. Accurately controlling and/or reducing the dimensions of RF lines may contribute to optoelectronic assemblies with suitable and/or favorable RF performance. However, the design and positioning of components of optoelectronic assemblies may prevent the length RF lines from being sufficiently controlled and/or minimized. The electrical performance of the RF lines may be particularly important for relatively high frequency optoelectronic assemblies, such as those that operate at 1, 2, 4, 10, 30 gigabits per second (Gb/s) or higher.

Components such as optoelectronic subassemblies or portions of optoelectronic subassemblies may be produced in large quantities and the produced components may need to comply with specifications that specify various aspects of the produced components (e.g. shape, dimensions and/or positioning). The produced components may include variations in the specifications. Some variation in specifications may be permitted because the produced components may be suitable or work properly. Some variations in specifications may result in components that are unsuitable. Tolerance may refer to an allowable amount of variation of a specification (e.g. dimension or positioning). Some specifications may have higher ("wider") or lower ("tighter") tolerance. For example, outside dimensions of optoelectronic subassemblies may have a wider tolerance because the variations may not affect the operation of the produced optoelectronic subassemblies. In another example, the positioning of optical components may require a tighter tolerance because the positioning affects the focus and/or transmission of optical signals. In yet another example, the dimensions of RF lines may require tighter tolerances because the dimensions may significantly affect RF performance.

The selected production processes may affect the prevalence and extent of the variations. In some circumstances the production processes may be controlled to increase or decrease the range of variation, the frequency of the variations, or other aspects. In some circumstances, producing components to tighter tolerances may increase production costs (or vice versa). For example, the tighter tolerance production processes may be more expensive than wider tolerance production processes. Tighter tolerance may result in more unsuitable components. Unsuitable components may be discarded without recovering production costs or repaired adding to production costs. Production processes may be modified to decrease or eliminate the production of unsuitable components, but in some circumstances this may increase costs.

FIGS. 1A-1B illustrate an example optoelectronic subassembly 460. The optoelectronic subassembly 460 may include an optical component 400 and a header subassembly 420. The optoelectronic subassembly 460 may include: a TOSA configured to convert electrical signals to optical signals; a ROSA configured to convert optical signals to electrical signals; or a TOSA and a ROSA to convert both electrical signals to optical signals and optical signals to electrical signals.

The header subassembly 420 can include a multi-layer substrate 442 with intermediate layers 446 positioned between a top layer 440 and a bottom layer 448 and optoelectronic components 428 coupled to or formed on the multi-layer substrate 442. The optoelectronic components 428 may be configured to transmit and/or receive optical signals to and/or from a fiber optic network. Additionally or alternatively, the optoelectronic components 428 may be configured to convert electrical signals to optical signals and/or convert optical signals to electrical signals.

The optical component 400 may include a housing 406 extending between a housing top 416 and a housing bottom 418. The housing 406 may include a window 402, an aperture 412 defined by the housing 406, and a lens 404 configured to convey, direct and/or focus optical signals. The housing bottom 418 may include a housing flange 414 configured to be coupled with the header subassembly 420. In some configurations, the optical component 400 may hermetically seal portions of the header subassembly 420.

FIGS. 2A-2E and 3 illustrate the header subassembly 420 that may be part of the optoelectronic subassembly 460. The header subassembly 420 may include a housing seat 430 configured to be coupled to the housing flange 414. The optoelectronic components 428 may include any suitable components that may be used in optoelectronic subassemblies such as TOSAs, ROSAs and/or other optoelectronic subassemblies. The optoelectronic components 428 may include drivers, monitor photodiodes, integrated circuits, inductors, capacitors, receivers, receiver arrays, control circuitry, lenses, laser arrays, or any suitable optoelectronic components. The optoelectronic components 428 may include an optical component 426 such as a prism, lens, mirror, filter, or other suitable component. Some of the optoelectronic components 428 may be electrically coupled to one another by signal lines 438, wire bonds (not shown), or other suitable interconnections. Additionally or alternatively, some of the optoelectronic components 428 may be optically coupled to one another.

In one configuration, if the optoelectronic subassembly 460 includes a TOSA, the optoelectronic components 428 may include a laser 424 or a laser array (for example if the optoelectronic subassembly 460 is a multi-channel optoelectronic subassembly). In another configuration, if the optoelectronic subassembly 460 includes a ROSA, the optoelectronic components 428 may include a receiver or a receiver array (for example if the optoelectronic subassembly 460 is a multi-channel optoelectronic subassembly). In further configurations, the header subassembly 420 may include both a TOSA and a ROSA and the optoelectronic components 428 may include suitable components for both TOSAs and ROSAs.

Although as illustrated the optoelectronic components 428 appear discrete, the optoelectronic components 428 may not be discrete components. The optoelectronic components 428 may be built in to the multi-layer substrate 442 between various layers, and/or printed between the layers of the multi-layer substrate 442. The layers of the multi-layer substrate 442 may contribute to capacitive properties and/or function as power and ground planes, and/or may have a dielectric in between them, thereby permitting operation as a parallel plate capacitor.

In non-illustrated configurations, the optoelectronic subassembly 460 may be configured to be part of a multi-channel optoelectronic assembly. Aspects of the header subassembly 420 may facilitate precise positioning and/or spacing of the signal lines 438, vias 452 and/or traces 432 to electrically couple a multi-channel laser array and/or multi-channel receiver array configured to send and/or receive multiple sets of optical signals, each set of optical signals corresponding to one channel of a multi-channel optoelectronic subassembly. In some configurations, the optoelectronic subassembly 460 may be a four channel optoelectronic subassembly configured to send and/or receive four channels of data. In some aspects, the optoelectronic subassembly 460 may comply with the QSFP standard.

Aspects of the optoelectronic subassembly 460 may contribute to decreased production costs. For example, some aspects of the optoelectronic subassembly 460 may simplify the production processes and/or may decrease the costs of the materials used to produce the optoelectronic subassembly 460. Some aspects of the optoelectronic subassembly 460 may facilitate cost-effective production of the optoelectronic subassembly 460 with desirable RF performance.

Aspects of the header subassembly 420, which will be described in further detail below, may permit precise positioning and/or spacing of the signal lines 438 and/or optoelectronic components 428. This may facilitate production of compact optoelectronic subassemblies incorporating the header subassembly 420. Additionally or alternatively, precise positioning and/or spacing of the signal lines 438 may permit optoelectronic components 428 of larger size or greater quantities to be included in the optoelectronic subassembly 460 because the optoelectronic components 428 may be positioned closer to one another.

Aspects of the header subassembly 420 may facilitate maintaining the integrity of the data signals transmitted through the signal lines 438 which may include maintaining signal impedance within acceptable levels. In one aspect, the impedance may be managed by precisely controlling the shape, position, and/or dimensions of RF lines which may be the signal lines 438, vias 452 and/or traces 432 (See for example FIG. 3). The shape, position, and/or dimensions of the signal lines 438, vias 452 and/or traces 432 can be selected based on the electrical and RF conditions that are to be experienced in the optoelectronic subassembly 460. For example, computer simulations of various designs of the signal lines 438, vias 452 and/or traces 432 can be performed to identify those that generate acceptable RF performance or RF responses.

The multi-layer substrate 442 may include intermediate layers 446 positioned between the top layer 440 and the bottom layer 448. Each layer of the multi-layer substrate 442 may be planar and positioned parallel to one another (although other configurations can also be implemented). As illustrated, the multi-layer substrate 442 can include five total layers with three intermediate layers 446 between the top layer 440 and the bottom layer 448. However, the multi-layer substrate 442 may include any suitable number of total layers or intermediate layers 446. In some configurations, the bottom layer 448 may refer to multiple bottom layers 448 and the top layer 440 may refer to multiple top layers 440. In some circumstances, the multi-layer substrate 442 may include more than ten total layers. The layers of the multi-layer substrate 442 (e.g. the bottom layer 448, the intermediate layers 446 and/or the top layers 440) may be formed out of any substrate material such as a ceramic material. At least a portion of the multi-layer substrate 442 may be formed of a ceramic material. At least a portion of the multi-layer substrate 442 may be formed of silicon, silicon dioxide, alumina, aluminum nitrate, aluminum oxide, sapphire, germanium, gallium arsenide, an alloy of silicon and germanium, or indium phosphide.

The signal lines 438 (only some of which are labeled in the Figures for clarity) may electrically couple any of the optoelectronic components 428 to transmit power, data signals, and/or control signals to the optoelectronic components 428 and/or to other components. Some of the signal lines 438 may be RF lines. In some configurations, the signal lines 438 may be coupled to or integral with the top layer 440. Although the signal lines 438 may be formed of any suitable conductive material, in some examples the signal lines 438 may be formed of a metal such as silver (Ag), gold (Au), nickel (Ni), titanium (Ti), palladium (Pd), tungsten (W), tungsten-molybdenum (WMo) or other material. The signal lines 438 may be formed by any suitable method. In some aspects, the signal lines 438 may be formed by a thin film metallization process. In such aspects, the thin film metallization process may permit the RF lines to be controlled and/or minimized to maintain RF performance.

The traces 432 of conductive material (only some of which are labeled in the Figures for clarity) may be coupled to or integral with one or more of the intermediate layers 446. Although the traces 432 may be formed of any suitable conductive material, in some examples the traces 432 may be formed of a metal such as silver (Ag), gold (Au), nickel (Ni), titanium (Ti), palladium (Pd), tungsten (W), tungsten-molybdenum (WMo) or other material. The traces 432 may be formed by any suitable method. In some aspects, the traces 432 may be formed by a cost-effective process such as a thick film metallization process. In some configurations, the traces 432 may be part of the signal lines 438.

The header subassembly 420 may include contact pads 444 (only some of which are labeled in the Figures for clarity) that are capable of permitting electrical power and/or control signals to be transmitted to the header subassembly 420 and/or the optoelectronic components 428. In some configurations, the contact pads 444 may be coupled to or integral with the bottom layer 448. The contact pads 444 may be capable of engaging flex circuits, printed circuit boards ("PCBs"), or other connectors and/or electronic assemblies. Although the contact pads 444 may be formed of any suitable conductive material, in some examples the contact pads 444 may be formed of a metal such as silver (Ag), gold (Au), nickel (Ni), titanium (Ti), palladium (Pd), tungsten (W), tungsten-molybdenum (WMo) or other material. The contact pads 444 may be formed by any suitable method. In some aspects, the contact pads 444 may be formed by a cost-effective process such as a thick film metallization process. In some configurations, the contact pads 444 may be part of the signal lines 438.

The vias 452 of conductive material (only some of which are labeled in the Figures for clarity) may extend through a portion of the multi-layer substrate 442. For example, one or more of the vias 452 may extend through one or more of: the bottom layer 448, at least one of the intermediate layers 446, and the top layer 440. Some of the vias 452 may be electrically coupled to the traces 432, the contact pads 444, the signal lines 438, and/or the optoelectronic components 428. The vias 452 may permit power and/or control signals to travel between the traces 432, the contact pads 444, the signal lines 438, and/or the optoelectronic components 428.

In some configurations, the vias 452 may be formed with the multi-layer substrate 442 or coupled to the multi-layer substrate 442 after some or all of the layers are coupled to one another. For example, one or more of the layers of the multi-layer substrate 442 may include conductive material such as the traces 432 that form the vias 452 when the layers are coupled to one another. In another example, an opening may be formed through one or more of the layers of the multi-layer substrate 442 and a conductive material may be positioned in the opening to form the vias 452. The openings may be drilled or punched through one or more layers of the multi-layer substrate 442. A conductive material may then be deposited or metallized within the openings to form the vias 452. Although the vias 452 may be formed of any suitable conductive material, in some examples the vias 452 may be formed of a metal such as copper (Cu), silver (Ag), gold (Au), nickel (Ni), titanium (Ti), palladium (Pd), tungsten (W), tungsten-molybdenum (WMo) or other material. In some configurations, the vias 452 may be part of the signal lines 438.

With reference to FIGS. 1A-1B, 2A-2E, and 3, aspects of forming the multi-layer substrate 442 will be described in further detail. Aspects of the described process can be applied to other structures similar or substantially different from the illustrated Figures. Forming the multi-layer substrate 442 may include forming material layers of ceramic materials. The material layers may be formed by any suitable process or combination of processes. Some or all of the material layers may be formed of silicon, silicon dioxide, alumina, aluminum nitrate, aluminum oxide, sapphire, germanium, gallium arsenide, an alloy of silicon and germanium, or indium phosphide.

Each of the material layers may be planar and correspond to the layers of the multi-layer substrate 442. Specifically, a top material layer may correspond to the top layer 440, the bottom material layer may correspond to the bottom layer 448, and/or the intermediate material layers may correspond to the intermediate layers 446. In some circumstances, the top and/or bottom material layers may be formed by a different process than the intermediate material layers.

As will be described in further detail below, each of the material layers may eventually be diced or cut to be separated into individual units. In some circumstances, performing certain processing steps (described below) on the material layers before they are separated may facilitate cost effective and/or efficient production of the multi-layer substrate 442 because multiple multi-layer substrates may be formed from the material layers. Performing certain processing steps on the material layers rather than the layers of the multi-layer substrate 442 may simplify the production process, decrease material costs, and/or decrease the time frame of production.

In some configurations, thick film metallization may be used to form the traces 432 on the intermediate layers 446 and thin film metallization may be used to form the signal lines 438 on the top layer 440 and/or the bottom layer 448. Thick film metallization and thin film metallization will be described in further detail below. Thin film metallization may permit precise positioning and/or spacing of the signal lines 438 and/or optoelectronic components 428. Thin film metallization may facilitate impedance management by controlling the shape, position, and/or dimensions of the signal lines 438 to tight tolerances. Thick film metallization may facilitate cost-effective production of the intermediate layers 446 and/or the header subassembly 420. In some aspects, thick film processing facilitates simple and flexible manufacture of multi-layers with several conductive layers on the front and/or back of some of the layers. The combination of thin and thick film metallization may facilitate cost-effective production of the optoelectronic subassembly 460 with desirable RF performance. The combination of thin and thick film metallization may permit more or larger optoelectronic components 428 to be included on the optoelectronic subassembly 460.

Forming the multi-layer substrate 442 may include forming conductive or semi-conductive traces by thick film metallization ("thick film metallizing"). Thick film metallizing may form conductive or semi-conductive traces on the intermediate layers 446, such as the traces 432. In some circumstances, thick film metallizing may form the contact pads 444. In some configurations, thick film metallizing may form conductive or semi-conductive traces on the top and bottom layers 440, 448. In other configurations, thick film metallizing may not be used to form conductive or semi-conductive traces on the top and bottom layers 440, 448. Layers that undergo thick film metallization may be referred to as thick film layers. The conductive or semi-conductive traces may be formed on either a top side or a bottom side of the thick film layers. Any of the steps of thick film metallizing (described below) may be applied to the top side of the thick film layers, the bottom side of the thick film layers, or both.

Thick film metallizing may include depositing a metalizing composition on the thick film layers, such as one or more of the intermediate material layers or one or more of the intermediate layers 446. The metalizing composition may be deposited by any suitable process, for example printing or coating. Examples of suitable printing processes may include screen-printing, rotary printing, press printing and/or inkjet printing. The metalizing composition may include conductive or semi-conductive materials such as metals, ceramic powders and/or an organic medium. In some configurations, the metalizing composition may include copper (Cu), silver (Ag), gold (Au), nickel (Ni), titanium (Ti), palladium (Pd), tungsten (W), tungsten-molybdenum (WMo) or other materials.

Screen-printing may include positioning a stencil on or over the thick film layers. Portions of the thick film layers covered by the stencil may be referred to as covered portions and portions of the thick film layers not covered by the stencil may be referred to as uncovered portions. Screen-printing may include moving a fill blade or a squeegee across the stencil and/or the thick film layers. Screen-printing may include depositing the metalizing composition on uncovered portions of the thick film layers. Screen-printing may include depositing the metalizing composition on the stencil over covered portions of the thick film layers (and thereby not depositing the metalizing composition on the covered portions of the thick film layers). Screen-printing metalizing composition may include repeating any of the above screen-printing steps for multiple layers of the metalizing composition. In some configurations, each layer of the multiple layers of metalizing composition may include different compositions.

Thick film metallizing may include drying and/or curing. Drying and/or curing may include permitting the metalizing composition to settle for a time period after printing. Drying and/or curing may include permitting a liquid component of the metalizing composition to evaporate. Evaporating the liquid component of the metalizing composition may couple or facilitate coupling the metalizing composition to the substrate. Drying and/or curing may include heating the metalizing composition and/or the thick film layers to facilitate and/or accelerate evaporation. Drying and/or curing may include heating the metalizing composition and/or the thick film layers to couple or facilitate coupling the metalizing composition to the substrate. Drying and/or curing may include directing and/or exposing the metalizing composition to a certain wavelength of light (e.g. ultraviolet light), or other radiation (radiation being energy transmitted in the form of rays or waves or particles). Drying and/or curing transform (or contribute to transforming) the metalizing composition to conductive or semi-conductive traces such as the traces 432.

Thick film metallizing may include firing the metalizing composition and or the thick film layers. Firing could include exposing the metalizing composition and/or the thick film layers to an elevated temperature for a length of time. Additionally or alternatively to the drying and/or curing, firing may transform (or contribute to transforming) the metalizing composition to conductive or semi-conductive traces such as the traces 432. Firing may include sintering, bonding and/or annealing of the metalizing composition and/or the thick film layers.

The elevated temperature could be any suitable temperature and may depend on various properties of the metalizing composition and/or the thick film layers. For example, the elevated temperature may depend on the composition, dimensions and/or other properties of the metalizing composition and/or the thick film layers. The elevated temperature may also depend on various aspects of the firing process such as pressure, exposure time and/or other aspects. The elevated temperature could be greater than 300° C., for example in a range between 600° C. and 1800° C. In some configurations, the elevated temperature could be around 850° C., for example in a range between 650° C. and 1050° C. In such configurations, the elevated temperature can contribute to forming traces 432 with desirable electrical characteristics and/or adhesive strength.

Thick film metallizing may include removing material such as a portion of the thick film layers, a portion of the metalizing composition, and/or a portion of the traces 432. The removing may include machining, cutting, etching, trimming and/or other suitable process. Trimming may include removing a portion of the traces 432 to adjust the dimensions of the metalizing composition and/or adjust the electrical characteristics of the traces 432. For example, portions of the traces 432 may be removed by laser trimming so the traces have a specific resistive value, voltage response, frequency response, tolerance and/or other characteristics. Trimming may include permitting electrical current to flow through the traces 432, evaluating feedback from the traces 432, and/or actively removing portions of the traces 432 to adjust resistance, voltage response, frequency response, tolerance and/or other characteristics.

In some examples, thick film metallization may produce traces with a height tolerance of 0.13 millimeters (plus or minus) or greater. In some examples, thick film metallization may produce traces with a width of about 0.15 millimeters and/or with a tolerance of 0.13 millimeters (plus or minus) or greater. In some examples, thick film metallization may produce traces with a width between 0.10 and 0.20 millimeters, between 0.05 and 0.25 millimeters, between 0 and 0.3 millimeters. In some examples, thick film metallization may produce traces with spacing between traces of 0.15 millimeters and/or with a tolerance of 0.13 millimeters (plus or minus) or greater.

Forming the multi-layer substrate 442 may include forming conductive or semi-conductive signal lines by thin film metallization ("thin film metallizing"). Thin film metallizing may form conductive or semi-conductive signal lines on the top and bottom layers 440, 448, such as signal lines 438. Although not illustrated, the signal lines 438 may be positioned on the bottom layer 448. In some circumstances, thin film metallizing may form the contact pads 444. In some configurations, thin film metallizing may not be used to form conductive or semi-conductive traces on the intermediate layers 446. Layers that undergo thin film metallization may be referred to as thin film layers. The conductive or semi-conductive traces may be formed on either a top side or a bottom side of the thin film layers. In some circumstances, the signal lines 438 may be positioned on the top side of the top layer 440 to electrically couple to the optoelectronic components 428. Any of the steps of thin film metallizing (described below) may be applied to the top side of the thin film layers, the bottom side of the thin film layers, or both.

Thin film metallizing may include depositing a thin film of conductive or semi-conductive material ("thin film material") on the thin film layers. The thin film material may include copper (Cu), silver (Ag), gold (Au), nickel (Ni), titanium (Ti), palladium (Pd), tungsten (W), tungsten-molybdenum (WMo) or other material. Depositing may include any process for depositing the thin film of material, for example, plating, chemical solution deposition, spin coating, chemical vapor deposition ("CVD"), spin coating, chemical vapor deposition, plasma enhanced CVD, atomic layer deposition, thermal evaporation, sputtering, or other suitable processes.

In some circumstances, depositing by chemical vapor deposition ("CVD"), may permit the dimensions of the signal lines 438 (e.g. height, stack up height, metallization width, spacing between signal line the signal lines 438, or other dimensions) to be accurately controlled within acceptable tolerances. In some circumstances, depositing by chemical vapor deposition may permit cost-effective production of the signal lines 438 to sufficient dimensions and tolerances.

CVD may include exposing the thin film layers to a precursor gas. The precursor gas may include an element to be deposited to form the conductive or semi-conductive material on the thin film layer. The precursor gas may be a volatile precursor that may react and/or decompose on a surface of the thin film layers to produce a deposit. The precursor gas may be diluted in carrier gases. CVD may include heating the thin film layers and/or controlling the temperature of the thin film layers. CVD may include delivering precursor gases into a reaction chamber at approximately ambient temperatures. As the precursor gas passes over or comes into contact with the thin film layers, they may react or decompose forming a solid phase deposit onto the thin film layers, forming for example, the signal lines 438. Thin film metallizing may include drying, curing, firing and/or other suitable processing steps.

Thin film metallizing may include removing a portion of the deposit, the signal lines 438 and/or a portion of the thin film layers. The removing may include machining, cutting, etching, trimming and/or other suitable process. Trimming may include removing a portion of the signal lines 438 to adjust the dimensions of the metalizing composition and/or adjust the electrical characteristics of the signal lines 438. For example, portions of the signal lines 438 may be removed by laser trimming so the traces have a specific resistive value, voltage response, frequency response, tolerance and/or other characteristics. Trimming may include permitting electrical current to flow through the signal lines 438, evaluating feedback from the signal lines 438, and/or actively removing portions of the signal lines 438 to adjust resistance, voltage response, frequency response, tolerance and/or other characteristics. In some configurations, signal lines 438 formed by thin film metallizing and/or CVD may not require removing any portion of the signal lines 438 because the dimensions, resistive value, voltage response, frequency response, tolerance and/or other characteristics of the signal lines 438 may be accurately controlled.

In some examples, thin film metallization may produce signal lines of titanium with a height (or stack up height) of about 0.1 microns and/or with a tolerance of 30 microns (plus or minus). In some examples, thin film metallization may produce signal lines of palladium with a height (or stack up height) of about 0.2 microns and/or with a tolerance of 30 microns (plus or minus). In some examples, thin film metallization may produce signal lines of gold with a height of about 3 microns with a tolerance of 1 microns (plus or minus). In some examples, thin film metallization may produce signal lines of gold with a height of between 2 and 4 microns, between 1 and 5 microns, between 0 and 6 microns, about 3 microns, or other suitable height. In some examples, thin film metallization may produce signal lines with a height tolerance of 1 microns (plus or minus). In some examples, thin film metallization may produce signal lines with a width of about 0.03 millimeters and/or with a tolerance of 0.03 millimeters (plus or minus). In some examples, thin film metallization may produce signal lines with a width between 0.01 and 0.05 millimeters. In some examples, thin film metallization may produce signal lines with spacing between signal lines of 0.03 millimeters with a tolerance of 0.03 millimeters (plus or minus). In some examples, thin film metallization may produce signal lines with spacing between signal lines of between 0.01 and 0.05 millimeters.

The multi-layer substrate 442 may be formed by aligning one or more of the material layers and then coupling the aligned material layers to one another. The aligned material layers may be coupled by thermal bonding, welding, adhesive, mechanical fastening, any suitable process and/or a combination of the aforementioned. In some aspects, aligned and coupled material layers may be separated into individual units forming multi-layer substrates such as the multi-layer substrate 442. For example, aligned and coupled material layers may be cut into several multi-layer substrates. The aligned and coupled layers may be cut by mechanical cutting, laser cutting, plasma cutting, machining or any other suitable process.

Forming the multi-layer substrate 442 may include scribing, profiling and/or drilling. Scribing may include incising and/or mechanically removing portions of the multi-layer substrate 442 or the material layers to weaken the multi-layer substrate 442 or the material layers to facilitate mechanical separation. Scribing may include firing laser pulses in a line across the multi-layer substrate 442 or the material layers, the laser pulses removing material corresponding to a straight or curved line, thereby weakening the multi-layer substrate 442 or the material layers so portions may be mechanically separated.

At various stages of production, at least one of the optoelectronic components 428 may be coupled to at least one of: the material layers, the top layer 440, the bottom layer 448 and the intermediate layers 446. The at least one of the optoelectronic components 428 may be physically, electrically or optically coupled. Additionally or alternatively, at least one of the optoelectronic components 428 may be formed on at least one of: the material layers, the top layer 440, the bottom layer 448 and the intermediate layers 446. For example, at least one of the optoelectronic components 428 may be coupled to or formed on the top material layer after the signal lines 438 are formed. In another example, at least one of the optoelectronic components 428 may be coupled to or formed on the top layer 440 after the signal lines 438 are formed, but after the material layers are separated to form individual units of multi-layer substrates. In yet another example, at least one of the optoelectronic components 428 may be coupled to or formed on the bottom layer 448 or the bottom material layer. In some circumstances, it may be more cost-effective to form or couple some of the optoelectronic components 428 before the material layers are separated to form individual units of multi-layer substrates.

In some configurations, thin film metallization may be controlled to produce signal lines 438 with tighter tolerance than traces 432 produced by thick film metallization (or vice versa). For example, the signal lines 438 produced by thin film metallization may include tighter tolerances for positioning, height, width, spacing and/or other dimensions than the tolerances for positioning, height, width, spacing and/or other dimensions of the traces 432. In one example, thin film metallization may produce signal lines 438 with a width of about 0.03 millimeters with a tolerance of 0.01 millimeters (plus or minus) and thick film metallization may produce traces 432 with a width of about 0.15 millimeters with a tolerance of 0.01 millimeters (plus or minus). In another example, thin film metallization may produce signal lines 438 with spacing between signal lines of 0.03 millimeters with a tolerance of 0.01 millimeters (plus or minus), and thick film metallization may produce traces 432 with spacing between traces of 0.15 millimeters with a tolerance of 0.075 millimeters (plus or minus).

Because thin film metallization may permit the signal lines 438 to be produced with tighter tolerances than the traces 432 produced by thick film metallization (or vice versa), some or all of the dimensions of the signal lines 438 may be smaller than some or all of the dimensions of the traces 432. For example, the signal lines 438 may include a width smaller than a width of the traces 432 and/or the signal lines 438 may include spacing smaller than spacing of the traces 432 (or vice versa). Also, a single deposition layer of a thin film metalized signal line may be thinner than a single deposition layer of a thick film metalized trace; however, after deposition of multiple layers, the heights of both the thin film signal lines and the thick film traces may vary and be thicker or thinner in comparison. That is, multiple deposition layers can result in thicker signal lines or thicker traces.

In such configurations, the tighter tolerance of the signal lines 438 may permit production of suitable signal lines 438 as well as suitable traces 432. Specifically, the smaller variation in the width and/or spacing of the signal lines 438 may permit production of suitable signal lines 438 with narrower widths and/or spacing because the tighter tolerances decreases or eliminates production of unsuitable signal lines that are touching one another because the widths are too wide or the spacing is too narrow. Additionally or alternatively, the larger width and/or spacing of the traces 432 may permit production of suitable traces 432 because the larger width and/or spacing of the traces 432 may decrease or eliminate the production of unsuitable traces that are touching one another because the widths are too wide or the spacing is too narrow (even though the dimensional tolerances of the traces 432 may be greater than the dimensional tolerances of the signal lines 438).

Thin film metallization may be used to produce signal lines 438 with tighter tolerances for positioning, height, width, spacing and/or other dimensions to permit, for example: closer placement of optoelectronic components 428, production of smaller header subassemblies such as the header subassembly 420, permit more optoelectronic components 428 to be positioned on the header subassembly 420. Thick film metallization may be used to produce features other than the signal lines 438 such as the traces 432 to facilitate low production costs in circumstance where tighter tolerances are not required.

Additionally or alternatively, thin film metallization may be used to produce RF lines such as the signal lines 438 with tighter tolerances for positioning, height, width, spacing and/or other dimensions to control RF response. Thick film metallization may be used to produce features other than RF lines such as the traces 432 to facilitate low production costs in circumstance where controlling RF response is not required.

Additionally or alternatively, the header subassembly 420 may include any suitable aspects of U.S. Provisional Application 62/069,712 filed Oct. 28, 2014, entitled SUBSTRATES INCLUDING OPTOELECTRONIC COMPONENTS which is hereby incorporated by reference in its entirety.

Figure 4A:
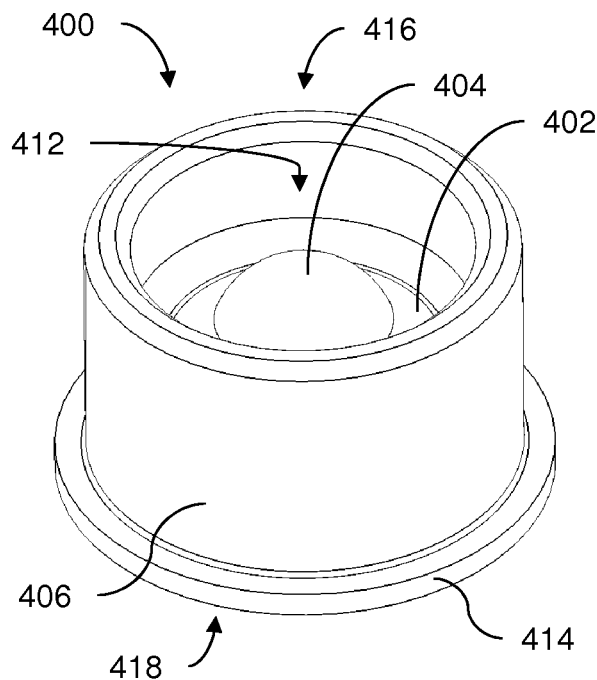
FIG. 4A is a top perspective view of an optical component of the optoelectronic subassembly of FIGS. 1A-1B.
Figure 4B:
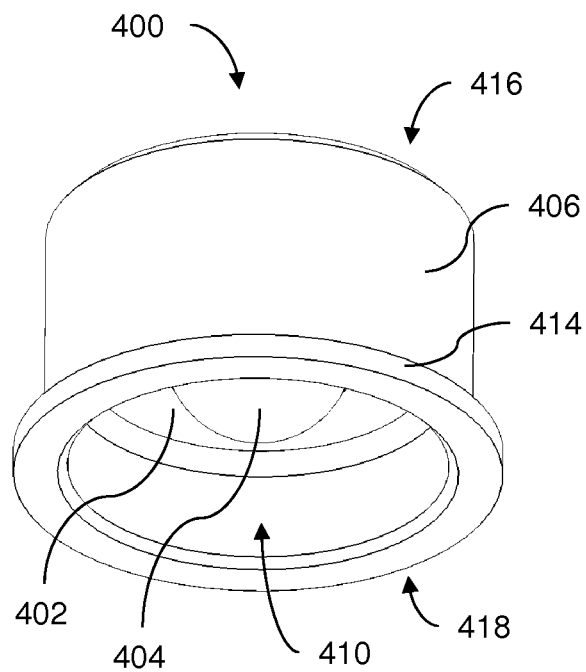
FIG. 4B is a bottom perspective view of the optical component of the optoelectronic subassembly of FIGS. 1A-1B.
Figure 4C:
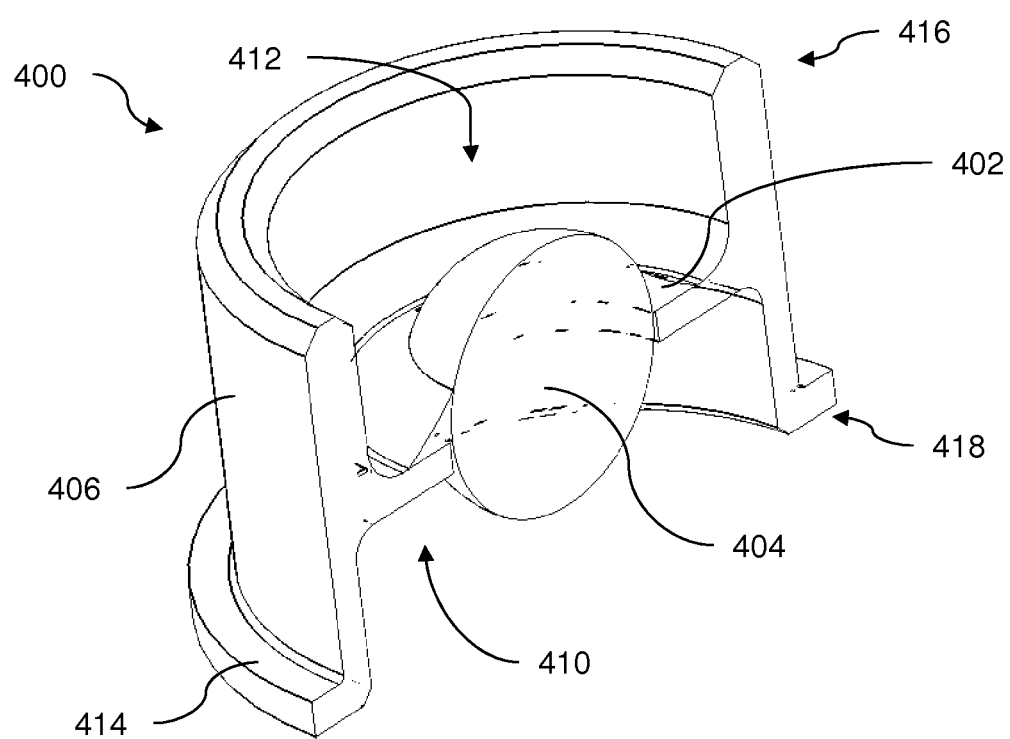
FIG. 4C is a cross-sectional perspective view of the optical component of the optoelectronic subassembly of FIGS. 1A-1B.

With reference to FIGS. 4A-4C, the optical component 400 will be described in further detail. The optical component 400 may include the housing 406 extending between the housing top 416 and the housing bottom 418. The housing top 416 and the housing bottom 418 generally refer to portions of the optical component 400 and are not limited to portions at or near the ends of the optical component 400. The housing 406 may include the window 402 and the aperture 412 defined by the housing 406. The aperture 412 may be configured to permit light signals to travel through at least a portion of the optical component 400 to the window 402. The window 402 may be at least partially optically transmissive and may include the lens 404 configured to convey, direct and/or focus optical signals travelling between optoelectronic components such as the header subassembly 420, an optical fiber and/or ferrule assemblies. For example, in some configurations, light signals may travel from the optical fiber, through the aperture 412 and the lens 404 of the optical component 400 to the header subassembly 420.

The optoelectronic subassembly 460 and or the optical component 400 may include any suitable aspects of U.S. patent application Ser. No. 14/881,693, filed Oct. 13, 2015, entitled MULTI-LENS OPTICAL COMPONENTS and U.S. Provisional Application 62/063,225, filed Oct. 13, 2014, entitled MULTI-LENS OPTICAL COMPONENTS, which are both hereby incorporated by reference in their entirety. Additionally or alternatively, the optoelectronic subassembly 660 may include any suitable aspects of U.S. patent application Ser. No. 14/831,499, filed Aug. 20, 2015, entitled LENS RECEPTACLES and U.S. Provisional Application 62/039,758, filed Aug. 20, 2014, entitled LENS RECEPTACLES which are both hereby incorporated by reference in their entirety.

The housing 406 and/or the window 402 may define a housing cavity 410. In some configurations, the housing cavity 410 may hermetically seal portions of header subassemblies when coupled to header subassemblies and thus may be referred to as a hermetically sealed housing cavity 410. In non-illustrated configurations, the housing 406 may include a window seal which may contribute to providing a hermetic seal between the optical component 400 and the window 402. In addition to or instead of contributing to providing a hermetic seal, the window seal may contribute to coupling the window 402 to the optical component 400.

The housing bottom 418 may be configured to interface with the header subassembly 420. The housing 406 may include a housing flange 414 positioned on the housing bottom 418. The housing flange 414 may be configured to be coupled to the housing seat 430 of the header subassembly 420. The optical component 400 may be coupled to the header subassembly 420 by welding, soldering, glass soldering, adhesives, fasteners, fusing or any other suitable technique. The coupling between the optical component 400 and the header subassembly 420 may contribute to hermetically sealing portions of the header subassembly 420 and/or optoelectronic components 428.

As illustrated, the header subassembly 420 may include a square or rectangular configuration. The header subassembly 420 may include other configurations such as circular, square with rounded or truncated corners, or any other suitable configuration. The housing top 416 may be configured to interface with a ferrule assembly or a receptacle. As illustrated, the optical component 400 may be substantially circular or annular, although in other configurations the optical component 400 may be any suitable configurations such as rectangular. In such configurations, the header subassembly 420, the ferrule assembly and/or the receptacle may include corresponding configurations to interface with the optical component 400, or vice versa. As illustrated, the housing top 416 may include a circular configuration that corresponds to a circular configuration of a ferrule assembly and/or a receptacle. In alternative configurations, the housing top 416 and the housing bottom 418 may include rectangular or other suitable configurations.

The housing 406 may be partially or entirely formed of any suitable material, for example metal, plastic polymer, glass or ceramic. The housing 406 may be formed by molding, machining, stamping, deposition, printing or any suitable technique. The window 402 may be formed partially or entirely of an optically transmissive material. For example, the window 402 may be formed partially or entirely of glass, plastic polymer, silicon compounds or other suitable materials. The window 402 may be formed by molding, machining, stamping, deposition or other suitable process. In some configurations, the window 402 may be integrally formed with the housing 406. In such configurations, the window 402 and the housing 406 may be formed of plastic polymer, glass or other suitable materials.

As illustrated, the lens 404 may be formed of optically transmissive convex surfaces on both sides of the window 402. The lens 404 may be configured to focus and/or transmit light signals between the optical fiber, the header subassembly 420, and/or other components. As illustrated, the lens 404 may include a circular configuration. In non-illustrated configurations, the lens 404 may include any suitable configurations such as oval, semi-circular, domed, spherical or any other practicable configuration. In some configurations, the lens 404 may be formed of a single convex surface on either one of the sides of the window 402.

The lens 404 may be integrally formed with the window 402 or coupled to the window 402 during or after its production. The window 402 and lens 404 may be integrally formed by molding, machining, stamping, deposition or other suitable process. In some circumstances, integrally molding the window 402 and lens 404 may contribute to cost-effective production of the optical component 400.

If the lens 404 is not integrally formed with the window 402, it may be individually formed by molding, machining, stamping, deposition, any other suitable process or combination of such processes. Then, the lens 404 may be coupled to the window 402 fusing, soldering, adhesive, or by any other suitable coupling technique. Alternatively, if the lens 404 is not integrally formed with the window 402, it may be formed on the window 402 by deposition, printing, machining or other suitable process.

In some configurations, a header subassembly can include: a multi-layer substrate with a bottom layer, a top layer having top thin film signal lines, and one or more intermediate layers having thick film traces between the top layer and the bottom layer, the thick film traces can be electrically coupled to the top thin film signal lines; and optoelectronic components can be positioned over the multi-layer substrate and electrically coupled with the signal lines.

In some configurations of the header subassembly, the top thin film signal lines can have a first dimension tolerance and the thick film traces can have a second dimension tolerance larger than the first dimension tolerance. In some configurations of the header subassembly, the first dimension tolerance of the top thin film signal lines can be about 0.01 millimeters and the second dimension tolerance of the thick film traces can be about 0.15 millimeters. In some configurations of the header subassembly, a tolerance of a width of the thick film traces can be greater than a tolerance of a width of the top thin film signal lines. In some configurations of the header subassembly, a tolerance of the spacing between the traces can be greater than a tolerance of the spacing between the top thin film signal lines. In some configurations of the header subassembly, a tolerance of a positioning of the thick film traces can be greater than a tolerance of a positioning of the top thin film signal lines. In some configurations of the header subassembly, a tolerance of a height of the thick film traces can be greater than a tolerance of a height of the top thin film signal lines.

In some configurations of the header subassembly, the top thin film signal lines can have a first dimension and the thick film traces can have a second dimension larger than the first dimension. In some configurations of the header subassembly, the top thin film signal lines can have a width or a spacing smaller than a width or a spacing of the thick film traces. In some configurations of the header subassembly, the top thin film signal lines can include a width between 0.03 and 0.05 millimeters and the thick film traces can include a width between 0.10 and 0.20 millimeters. In some configurations of the header subassembly, the top thin film signal lines can include a spacing of between 0.03 and 0.05 millimeters and the thick film traces can include a spacing of between 0.15 and 0.20 millimeters. In some configurations of the header subassembly, the top thin film signal lines can include a width of about 0.03 millimeters with a tolerance of 0.01 millimeters.

In some configurations of the header subassembly, the top thin film signal lines or the thick film traces can be formed of a metal, silver (Ag), gold (Au), nickel (Ni), titanium (Ti), palladium (Pd), tungsten (W) or tungsten-molybdenum (WMo). In some configurations of the header subassembly, the top thin film signal lines can be formed of titanium (Ti), palladium (Pd) or gold (Au).

In some configurations of the header subassembly, the top thin film signal lines can be formed of titanium with a height of about 0.1 microns with a tolerance of 0.05 microns. In some configurations of the header subassembly, the top thin film signal lines can be formed of titanium with a height between 0.05 and 0.15 microns. In some configurations of the header subassembly, the top thin film signal lines can be formed of palladium with a height of about 0.2 microns with a tolerance of 0.05 microns. In some configurations of the header subassembly, the top thin film signal lines can be formed of palladium with a height between 0.1 and 0.3 microns. In some configurations of the header subassembly, the top thin film signal lines can be formed of gold with a height about 3 microns with a tolerance of 2 microns. In some configurations of the header subassembly, the top thin film signal lines can be formed of gold with a height between: 0 and 6 microns, 1 and 5 microns, 2 and 4 microns and about 3 microns. In some configurations of the header subassembly, the top thin film signal lines can include a spacing between the signal lines of 0.03 millimeters with a tolerance of 0.01 millimeters. In some configurations of the header subassembly, the top thin film signal lines can include a width of 0.03 millimeters with a tolerance of 0.01 millimeters.

In some configurations of the header subassembly, the thick film traces can be formed of tungsten (W), nickel (Ni), or gold (Au). In some configurations of the header subassembly, the thick film traces can be formed of tungsten and can include a height between: 1 and 16 microns, 4 and 12 microns, 6 and 10 microns, 7 and 9 microns or about 8 microns. In some configurations of the header subassembly, the thick film traces can be formed of nickel and can include a height between: 0 and 6 microns, 0.1 and 5 microns, 1 and 3 microns or about 2 microns. In some configurations of the header subassembly, the thick film traces can include a width of about 0.15 millimeters with a tolerance of 0.13 millimeters or greater. In some configurations of the header subassembly, the thick film traces can include a width between: 0 and 0.15 millimeters or 0.05 and 0.2 millimeters. In some configurations of the header subassembly, the thick film traces can include a spacing of about 0.15 millimeters with a tolerance of 0.13 millimeters or greater. In some configurations of the header subassembly, the thick film traces can include spacing between the traces of between: 0 and 0.3 millimeters, 0.05 and 0.25 millimeters, or 0.10 and 0.20 millimeters.

In some configurations of the header subassembly, at least one layer of the multi-layer substrate can be formed with a ceramic material, silicon, silicon dioxide, alumina, aluminum nitrate, aluminum oxide, sapphire, germanium, gallium arsenide, an alloy of silicon and germanium, or indium phosphide. In some configurations of the header subassembly, the optoelectronic components can include one or more of: at least one receiver, at least one transmitter, a multi-channel receiver array and a multi-channel laser array, a driver, a monitor photodiode, an integrated circuit, an inductor, a capacitor, control circuitry, a lens, a prism, a mirror, and a filter. In some configurations of the header subassembly, the bottom layer can include bottom thin film signal lines. In some configurations of the header subassembly, at least one of the top thin film signal lines is an RF line. In some configurations, the header subassembly can include vias extending through at least a portion of the multi-layer substrate.

In some configurations of the header subassembly, the vias can be formed with a metal, silver (Ag), gold (Au), nickel (Ni), titanium (Ti), palladium (Pd), tungsten (W) or tungsten-molybdenum (WMo). In some configurations of the header subassembly, the vias can be electrically coupled to the signal lines. In some configurations, the header subassembly can include contact pads on the bottom layer, the contact pads electrically coupled to the vias. In some configurations of the header subassembly, the contact pads can be thin film contact pads or thick film contact pads. In some configurations of the header subassembly, the contact pads can be formed with a metal, silver (Ag), gold (Au), nickel (Ni), titanium (Ti), palladium (Pd), tungsten (W) or tungsten-molybdenum (WMo).

In some aspects, a method can include: forming material layers including a top material layer, a bottom material layer, and intermediate material layers; forming thick film traces on at least one of the material layers by thick film metallization; and forming thin film signal lines on at least one of the material layers by thin film metallization.

In some aspects, the method can include depositing a metalizing composition on the at least one of the material layers. In some aspects of the method, depositing the metalizing composition comprises one or more of: coating, printing, screen-printing, rotary printing, press printing and inkjet printing.

In some aspects of the method, depositing the metalizing composition can include one or more of: positioning a stencil over the at least one of the material layers; moving a fill blade across the stencil and the at least one of the material layers; depositing the metalizing composition on uncovered portions of the at least one of the material layers; and depositing the metalizing composition on the stencil over covered portions of the at least one of the material layers.

In some aspects of the method, the metalizing composition can include a conductive or semi-conductive material. In some aspects of the method, the metalizing composition can include one or more of: silver (Ag), gold (Au), nickel (Ni), titanium (Ti), palladium (Pd), tungsten (W) and tungsten-molybdenum (WMo).

In some aspects, the method can include drying or curing the at least one of the material layers. In some aspects, the method can include one or more of: permitting the metalizing composition to settle for a time period; permitting a liquid component of the metalizing composition to evaporate; heating the at least one of the material layers with the metalizing composition; exposing the metalizing composition to radiation; and firing the at least one of the material layers with the metalizing composition. In some aspects, the method can include one or more of: sintering, bonding and annealing the material layers with the metalizing composition.

In some aspects of the method, the thin film signal lines or the thick film traces can include one or more of: silver (Ag), gold (Au), nickel (Ni), titanium (Ti), palladium (Pd), tungsten (W) and tungsten-molybdenum (WMo).

In some aspects, the method can include depositing a thin film material on the at least one of the material layers. In some aspects of the method, the thin film material can include one or more of: silver (Ag), gold (Au), nickel (Ni), titanium (Ti), palladium (Pd), tungsten (W), and tungsten-molybdenum (WMo).

In some aspects of the method, depositing the thin film material can include one or more of: plating, chemical solution deposition, spin coating, chemical vapor deposition ("CVD"), spin coating, chemical vapor deposition, plasma enhanced CVD, atomic layer deposition, thermal evaporation and sputtering. In some aspects, the method can include exposing the at least one of the material layers to a precursor gas. In some aspects, the method can include heating the at least one of the material layers to a temperature greater than a temperature of the precursor gas. In some aspects, the method can include drying, curing, firing after the precursor gas forms a solid phase deposit on the at least one of the material layers.

In some aspects, the method can include forming the thin film signal lines on the top material layer. In some aspects, the method can include forming the thick film traces on at least one of the intermediate material layers. In some aspects, the method can include forming the thin film signal lines on the bottom material layer. In some aspects, the method can include forming contact pads on the bottom material layer by thin film metallization or thick film metallization.

In some aspects of the method, the material layers can be formed by one or more of: laser cutting, machining, scribing, mechanical cutting, plasma cutting, diamond cutting, sawing, and dicing. In some aspects of the method, at least one of the material layers can be formed of one or more of: silicon, silicon dioxide, alumina, aluminum nitrate, aluminum oxide, sapphire, germanium, gallium arsenide, an alloy of silicon and germanium, and indium phosphide. In some aspects, the method can include removing a portion of one or more of: the material layers, the thick film traces, and the thin film signal lines.

In some aspects, the method can include aligning one or more the material layers and coupling the aligned material layers to one another. In some aspects of the method, the material layers can be coupled by one or more of: thermal bonding, welding, adhesive and mechanical fastening. In some aspects, the method can include separating the coupled material layers into a plurality of multi-layer substrates. In some aspects of the method, the coupled material layers can be separated by one or more of: mechanical cutting, laser cutting, plasma cutting, scribing, profiling, drilling and machining.

In some aspects, the method can include one or more of: coupling at least one optoelectronic component to at least one of the material layers; and forming at least one optoelectronic component on at least one of the material layers. In some aspects of the method, the at least one optoelectronic component can be one or more of: a receiver, a transmitter, a multi-channel receiver array, and a multi-channel laser array.

In some configurations, an optoelectronic subassembly can include a header subassembly including any suitable aspects described above; an optical component including a housing extending between a housing top and a housing bottom, the optical component can include any one or more of: a window that can be at least partially optically transmissive, an aperture defined by the housing capable of permitting optical signals to travel the window, a lens capable of focusing the optical signals, a housing flange on the housing bottom, and a housing cavity defined by the housing; and the optical component can be coupled to the header subassembly and hermetically seal at least one of the optoelectronic components at least partially within the cavity.

In some configurations, a header subassembly can include: a multi-layer substrate with a bottom layer, a top layer with top thin film signal lines having a first dimension tolerance; and one or more intermediate layers having thick film traces between the top layer and the bottom layer, the thick film traces can be electrically coupled to the top thin film signal lines, the thick film traces can have a second dimension tolerance larger than the first dimension tolerance; and optoelectronic components can be positioned over the multi-layer substrate and can be electrically coupled with the signal lines. In some configurations this header subassembly can include any suitable aspects described above.

In some aspects, a method can include: forming a multi-layer substrate by forming a bottom layer, a top layer and intermediate layers; forming thick film traces on at least one of the intermediate layers by thick film metallization; and forming thin film signal lines on a top layer by thin film metallization; and coupling one or more optoelectronic components to the multi-layer substrate, the optoelectronic components can be configured to transmit or receive optical signals. In some aspects this method can include any suitable aspects described above.

Aspects of the present disclosure may be embodied in other forms without departing from its spirit or essential characteristics. The described aspects are to be considered in all respects illustrative and not restrictive. The claimed subject matter is indicated by the appended claims rather than by the foregoing description. All changes which come within the meaning and range of equivalency of the claims are to be embraced within their scope.

What is claimed is:

1. A header subassembly comprising:
a multi-layer substrate including:
   a bottom layer;
   a top layer having top thin film signal lines; and
   one or more intermediate layers having thick film traces between the top layer and the bottom layer, the thick film traces being electrically coupled to the top thin film signal lines; and
optoelectronic components positioned over the multi-layer substrate and electrically coupled with the top thin film signal lines;
wherein at least one of the top thin film signal lines comprises:
   titanium (Ti) having a height of about 0.1 microns with a tolerance of 0.05 microns;
   palladium (Pd) having a height of about 0.2 microns with a tolerance of 0.05 microns; or
   gold (Au) having a height about 3 microns with a tolerance of 2 microns.

2. The header subassembly of claim 1, wherein the top thin film signal lines have a first dimension tolerance and the thick film traces have a second dimension tolerance larger than the first dimension tolerance.

3. The header subassembly of claim 1, wherein the top thin film signal lines have a width or a spacing smaller than a width or a spacing of the thick film traces.

4. The header subassembly of claim 1, wherein the top thin film signal lines include one or more of:
   a spacing between the thin film signal lines of 0.03 millimeters with a tolerance of 0.01 millimeters; or a width of 0.03 millimeters with a tolerance of 0.02 millimeters.

5. The header subassembly of claim 1, the optoelectronic components including one or more of: at least one receiver, at least one transmitter, a multi-channel receiver array and a multi-channel laser array, a driver, a monitor photodiode, an integrated circuit, an inductor, a capacitor, control circuitry, a lens, a prism, a mirror, or a filter.

6. The header subassembly of claim 1, wherein at least one of the top thin film signal lines is an RF line.

7. The header subassembly of claim 1, further comprising contact pads on the bottom layer, the contact pads electrically coupled to vias extending through at least a portion of the multi-layer substrate, the vias electrically coupled to the top thin film signal lines.

8. A header subassembly comprising:
a multi-layer substrate including:
    a bottom layer;
    a top layer having top thin film signal lines; and
    one or more intermediate layers having thick film traces between the top layer and the bottom layer, the thick film traces being electrically coupled to the top thin film signal lines; and
optoelectronic components positioned over the multi-layer substrate and electrically coupled with the top thin film signal lines;
wherein the thin film signal lines include a spacing between the thin film signal lines of 0.03 millimeters with a tolerance of 0.01 millimeters.

9. A header subassembly comprising:
a multi-layer substrate including:
    a bottom layer;
    a top layer having top thin film signal lines; and
    one or more intermediate layers having thick film traces between the top layer and the bottom layer, the thick film traces being electrically coupled to the top thin film signal lines; and
optoelectronic components positioned over the multi-layer substrate and electrically coupled with the top thin film signal lines;
wherein at least one of the thin film signal lines includes a width of about 0.03 millimeters with a tolerance of 0.02 millimeters.

* * * * *